(12) United States Patent
Hwang et al.

(10) Patent No.: US 8,541,096 B2
(45) Date of Patent: Sep. 24, 2013

(54) PRINTED CIRCUIT BOARD AND METHOD OF MANUFACTURING THE SAME

(75) Inventors: Mi Sun Hwang, Gyunggi-do (KR); Jae Joon Lee, Gyunggi-do (KR); Myung Sam Kang, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 866 days.

(21) Appl. No.: 12/654,446

(22) Filed: Dec. 18, 2009

(65) Prior Publication Data

US 2011/0061905 A1 Mar. 17, 2011

(30) Foreign Application Priority Data

Sep. 15, 2009 (KR) .................. 10-2009-0087152

(51) Int. Cl.
*H05K 1/03* (2006.01)
*H05K 7/02* (2006.01)

(52) U.S. Cl.
USPC ........... 428/209; 428/901; 174/250; 174/255; 174/258; 257/759; 257/766; 257/774; 361/812

(58) Field of Classification Search
USPC ......... 174/261, 264, 250, 255, 258; 428/209, 428/901; 257/759, 766, 774; 361/812
See application file for complete search history.

(56) References Cited

U.S. PATENT DOCUMENTS

| | | | |
|---|---|---|---|
| RE29,784 E * | 9/1978 | Chadwick et al. ............. | 174/252 |
| 4,605,471 A * | 8/1986 | Mitchell ......................... | 216/18 |
| 5,879,787 A * | 3/1999 | Petefish ......................... | 428/209 |
| 6,258,449 B1 | 7/2001 | Nagasawa et al. | |
| 6,420,018 B1 * | 7/2002 | Inoue et al. .................... | 428/209 |
| 6,630,743 B2 * | 10/2003 | Magnuson et al. ............ | 257/774 |
| 6,767,616 B2 * | 7/2004 | Ooi et al. ....................... | 428/209 |
| 6,979,897 B2 * | 12/2005 | Ma ................................. | 257/691 |
| 7,122,901 B2 * | 10/2006 | Sunohara et al. .............. | 257/758 |
| 7,348,677 B2 * | 3/2008 | Larnerd et al. ................ | 257/774 |
| 7,730,613 B2 * | 6/2010 | Vasoya ........................... | 29/852 |
| 7,977,034 B1 * | 7/2011 | Lauffer et al. ................. | 430/311 |
| 2010/0321914 A1 | 12/2010 | Inagaki et al. | |

FOREIGN PATENT DOCUMENTS

| | | |
|---|---|---|
| JP | 2001-6590 | 1/2001 |
| KR | 2000-0006037 | 1/2000 |
| KR | 10-2009-0036152 | 4/2009 |
| KR | 10-2009-0053628 | 5/2009 |

OTHER PUBLICATIONS

Korean Office Action issued Mar. 2, 2011 in corresponding Korean Patent Application 10-2009-0087152.

* cited by examiner

*Primary Examiner* — Cathy Lam

(57) ABSTRACT

There is provided a printed circuit board. The printed circuit board may be configured to include: a core layer in which a bending prevention portion of at least two layers is interposed between a plurality of insulating members and includes metal layers having different thermal expansion coefficients is disposed; a circuit pattern that is formed so as to have a desired pattern on at least one of the inside of the core layer and an outer face of the core layer; and an insulating layer that is formed on the core layer and includes an opening portion that exposes the circuit pattern, and a method of manufacturing the printed circuit board. According to the above-described printed circuit board and the method of manufacturing the printed circuit board, by disposing a bending prevention portion inside the printed circuit board, a printed circuit board capable of improving the progress rate and the productivity and a method of manufacturing the printed circuit board can be provided.

7 Claims, 4 Drawing Sheets

PRINTED CIRCUIT BOARD AND METHOD OF MANUFACTURING THE SAME

CROSS-REFERENCE TO RELATED APPLICATIONS

This application claims the priority of Korean Patent Application No. 10-2009-0087152 filed on Sep. 15, 2009, in the Korean Intellectual Property Office, the disclosure of which is incorporated herein by reference.

BACKGROUND OF THE INVENTION

1. Field of the Invention

The present invention relates to a printed circuit board and a method of manufacturing thereof, and more particularly, to a printed circuit board capable of improving a manufacturing rate and productivity thereof by disposing a bending prevention portion inside the printed circuit board and a method of manufacturing the same.

2. Description of the Related Art

Recently, companies assembling and manufacturing circuit boards are focused on super precision technology in accordance with the trend of semiconductor package boards towards lightness, thinness, and compactness.

In particular, in a soldering process in which electrical bonding is connected between a semiconductor package board and a main board, as the thickness of the board decreases, the importance of lessening the bending of the semiconductor package board increases.

The bending of the semiconductor package board markedly affects the manufacturing rate and productivity thereof in implementing such a soldering process.

In addition, the bending of the semiconductor package board may cause a problem in which a solder ball is not formed on a solder ball pad of the semiconductor package board in a soldering process, a problem in which solder balls formed on a semiconductor element and the semiconductor package board are not bonded to each other in the process of mounting the semiconductor element, or the like, depending on the degree of bending. Accordingly, the bending of the semiconductor package board is a very important factor that may cause a defective electrical connection between the semiconductor element and the semiconductor package board.

A typical semiconductor package board is generally configured to have a package area including a semiconductor element mounting portion, an outer-layer circuit pattern and a dummy area surrounding the package area.

In such a typical semiconductor package board, the thickness of the outer-layer circuit pattern of the package area or the thicknesses of solder resist layers of the package area and the dummy area are controlled in an effort to attempt to maintain the overall balance of the semiconductor package board so as to reduce bending.

Furthermore, as the thickness of the copper clad laminate used as the inner-layer board core decreases, the occurrence of the bending of the typical semiconductor package board increases. Accordingly, there is a problem, in that it becomes more difficult to reduce the bending of the semiconductor package board by controlling the thickness of the outer-layer circuit pattern of the package area or the thicknesses of the solder resist layers of the package area and the dummy area.

SUMMARY OF THE INVENTION

An aspect of the present invention provides a printed circuit board and a method of manufacturing the same capable of improving the manufacturing rate and productivity thereof by disposing a bending prevention portion inside the printed circuit board.

According to an aspect of the present invention, there is provided a printed circuit board including: a core layer in which a bending prevention portion of at least two layers that is interposed between a plurality of insulating members and includes metal layers having different thermal expansion coefficients is disposed; a circuit pattern that is formed so as to have a desired pattern on at least one of the inside of the core layer and an outer face of the core layer; and an insulating layer that is formed on the core layer and includes an opening portion that exposes the circuit pattern.

The bending prevention portion may be configured to include a first bending prevention layer having a first of thermal expansion coefficient and a second bending prevention layer having a second thermal expansion coefficient that is higher than the first thermal expansion coefficient, from the opening portion side.

The bending prevention portion may be configured to include a second bending prevention layer having a second thermal expansion coefficient and a first bending prevention layer having a first thermal expansion coefficient that is lower than the second thermal expansion coefficient, from the opening portion side.

The first bending prevention layer may be formed from invar or nickel, and the second bending prevention layer is formed from copper or copper alloy.

The insulating layer may be a solder resist that is patterned so as to expose the circuit pattern.

The core layer in which the bending prevention portion of at least two layers that is interposed between the plurality of insulating members and includes metal layers having different thermal expansion coefficients is disposed may be included by replacing the insulating layer.

The printed circuit board may further include a solder resist that is patterned so as to expose the circuit pattern on the core layer.

The printed circuit board may further include a through hole formed by perforating at least one face of the core layer.

According to another aspect of the present invention, there is provided a method of manufacturing a printed circuit board. The method includes: arranging a core layer in which a bending prevention portion of at least two layers that includes metal layers having different thermal expansion coefficients is disposed between a plurality of insulating members; forming a circuit pattern so as to have a desired pattern on at least one of the inside of the core layer and an outer face of the core layer; and forming an insulating layer including an opening portion that exposes the circuit pattern on the core layer.

The bending prevention portion may be formed of a first bending prevention layer having a first thermal expansion coefficient and a second bending prevention layer having a second thermal expansion coefficient that is less than the first thermal expansion coefficient, from the insulating member side.

The bending prevention portion may be formed of a second bending prevention layer having a second thermal expansion coefficient and a first bending prevention layer having a first thermal expansion coefficient that is higher than the second thermal expansion coefficient, from the insulating member side.

The first bending prevention layer may be formed from copper or copper alloy, and the second bending prevention layer may be formed from invar or nickel.

The insulating layer may be formed as a solder resist that is patterned so as to expose the circuit pattern.

The forming of the core layer in which the bending prevention portion of at least two layers that includes metal layers having different thermal expansion coefficients between the plurality of insulating members is disposed may be performed by replacing the forming of the insulating layer.

The forming of the core layer may further include forming a solder resist patterned on the core layer.

The forming of the core layer may further include forming a through hole that perforates at least one face of the core layer.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1A:
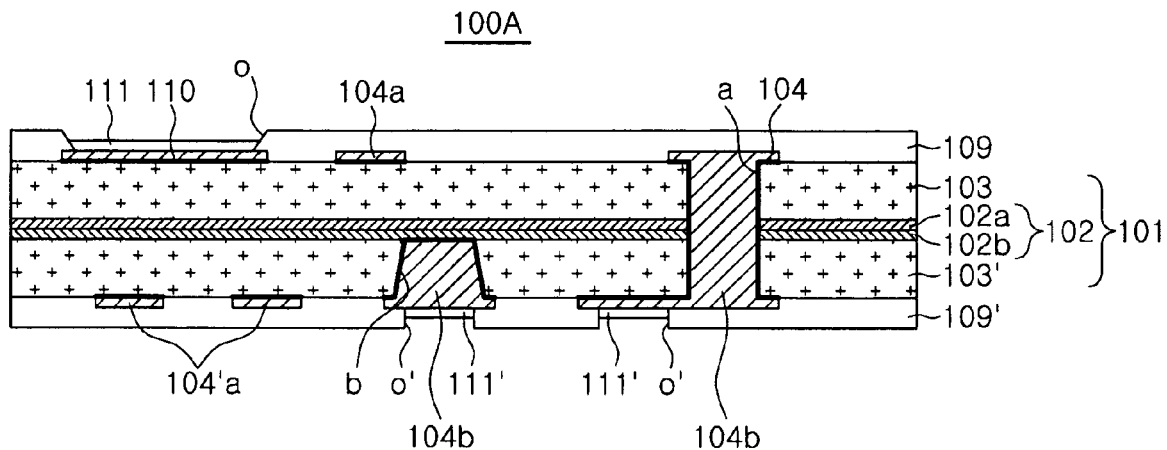
FIGS. 1A and 1B are schematic cross-sectional views illustrating a printed circuit board including a bending prevention portion according to an exemplary embodiment of the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

Hereinafter, a printed circuit board having a bending prevention portion according an exemplary embodiment of the present invention will be described in detail with reference to FIGS. 1 to 2.

Figure 1B:
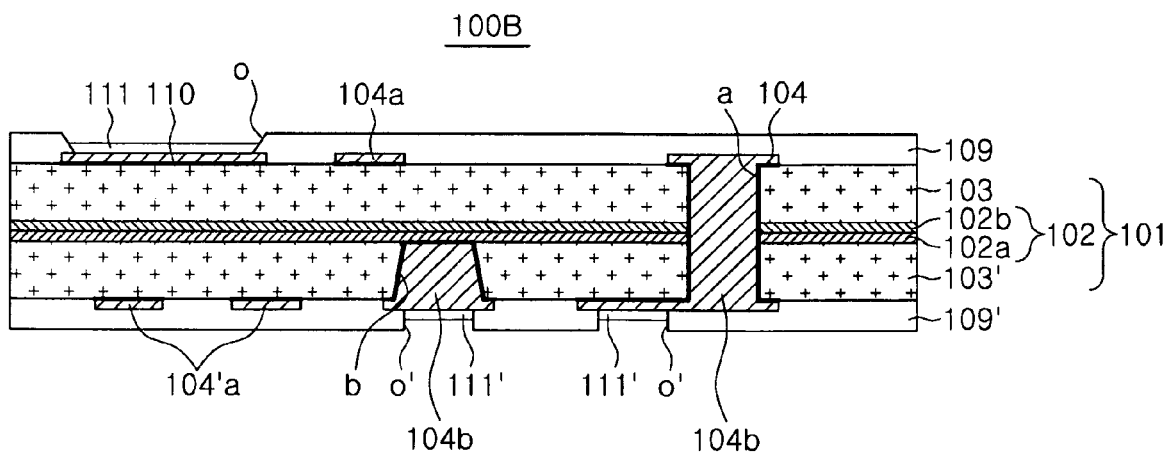

FIGS. 1A and 1B are schematic cross-sectional views of a printed circuit board including a bending prevention portion according to an exemplary embodiment of the present invention. The printed circuit board according to the first embodiment will be described based on a two-layered printed circuit board having a bending prevention portion as an example.

The printed circuit board 100A according to the exemplary embodiment of the present invention is configured to include a core layer 101 that includes a bending prevention portion 102 interposed between insulating members 103 and 103' and insulating layers 109 and 109' that are formed on circuit patterns 104 and 104', which are in turn formed on the inner side of the core layer 101 or the outer side of the insulating members 103 and 103', and the insulating members 103 and 103' and include opening portions O and O' that expose the circuit patterns 104 and 104' so as to be bonded to solder balls.

Here, the bending prevention portion 102 is interposed between the insulating members 103 and 103'. The bending prevention portion 102 is configured as two layers of metal having different thermal expansion coefficients and is disposed in the core layer 101.

In a case where the printed circuit board 100A is used as an upper board of a POP (Package On Package) board, the bending prevention portion 102 is configured to include a first bending prevention layer 102a having a first thermal expansion coefficient and a second bending prevention layer 102b having a second thermal expansion coefficient which is higher than the first thermal expansion coefficient, from the side of an opening portion O for bonding a solder ball in which a semiconductor element is to be mounted later.

On the contrary, in a case where a printed circuit board 100B is used as a lower board of the POP board, the bending prevention portion 102 is configured to include the second bending prevention layer 102b having the second thermal expansion coefficient and the first bending prevention layer 102a having the first thermal expansion coefficient, which is lower than the second thermal expansion coefficient, from the side of the opening portion O for bonding a solder ball in which a semiconductor element is to be mounted later.

As described above, a metal that can be configured as the bending prevention portion 102 according to the first embodiment of the present invention, may be any arbitrary metal as long as the metal satisfies the condition of configuring the first bending prevention layer 102a having the first thermal expansion coefficient and the second bending prevention layer 102b having the second thermal expansion coefficient that is higher than the first thermal expansion coefficient. As a preferred example, the bending prevention portion 102 according to the first embodiment of the invention may be configured to include invar or nickel (Ni) having a low thermal expansion coefficient as the first bending prevention layer 102a and copper or a copper alloy having a thermal expansion coefficient higher than that of invar or nickel as the second bending prevention layer 102b.

Commonly, as a printed circuit board for manufacturing a semiconductor package is exposed to a high-temperature heat through the manufacturing process, a phenomenon in which the printed circuit board is bent upward (the printed circuit board having a concave shape, when viewed from the lengthwise edge) or is bent downward (the printed circuit board having a convex shape, when viewed from the lengthwise edge) occurs.

Described in greater detail, a printed circuit board mounted on the upper package board shows a tendency to be bent into a concave shape at room temperature, and, on the other hand, to be bent into a concave shape at a high temperature. In contrast to the behavior of the upper package board, a printed circuit board that is mounted on the lower package board has a tendency to be bent into a convex shape at room temperature and to be bent into a concave shape at a high temperature.

In order to prevent the above-described printed circuit board bending phenomenon which occurs during a semiconductor package manufacturing process or through a reflow process, by disposing a bending prevention portion that is configured by a metal having a low thermal expansion coefficient and a metal having a high thermal expansion coefficient in the printed circuit board that is mounted in the upper package board with the semiconductor mounting surface used as a reference, and by disposing a bending prevention portion that is configured to have a metal having a high thermal expansion coefficient and a metal having a low thermal expansion coefficient in the printed circuit board that is mounted in the lower package board with the semiconductor mounting surface used as a reference, stresses generated by the tendency to be bent that are generated in different directions are offset with each other so as to perform a function of maintaining the printed circuit board in a horizontal state, whereby the bending phenomenon of the printed circuit board can be markedly decreased.

Here, the circuit patterns 104 and 104' are formed on the inside of through holes a and b, which are created by perforating one face and the other face of the core layer 101, or a part of the core layer 101 and both outer sides of the insulating members 103 and 103'. In addition, the circuit patterns 104 and 104' are formed so as to have predetermined patterns.

Here, the insulating layer 109 is formed on the insulating members 103 and 103' and includes the opening portions O and O' that expose the circuit patterns 104 and 104' so as to be later bonded to solder balls. The insulating layer 109 may be configured by a patterned solder resist.

Figure 2A:
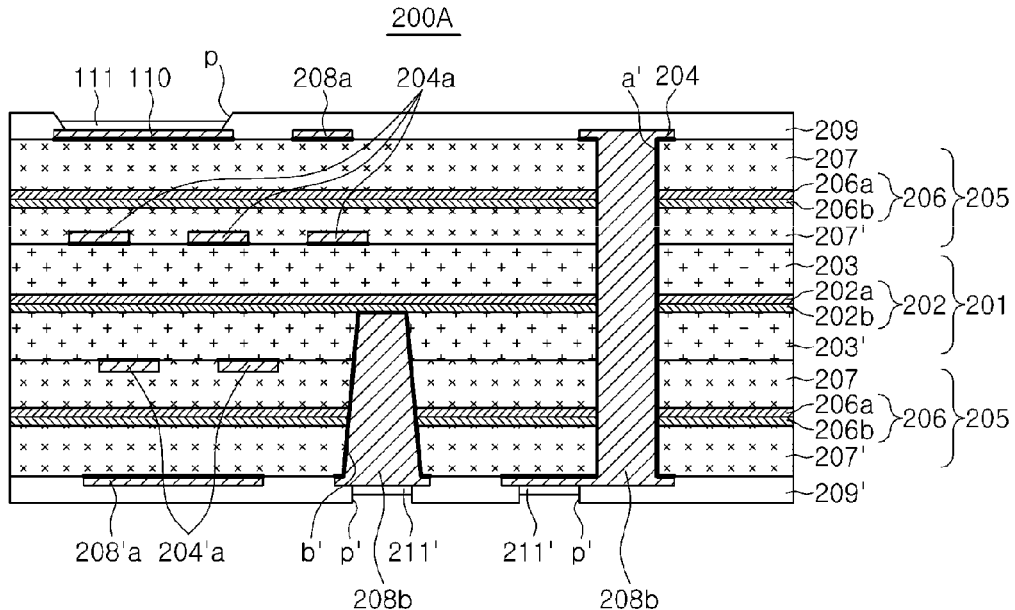
FIGS. 2A and 2B are schematic cross-sectional views of illustrating a printed circuit board including a bending prevention portion according to another exemplary embodiment of the present invention.
Figure 2B:
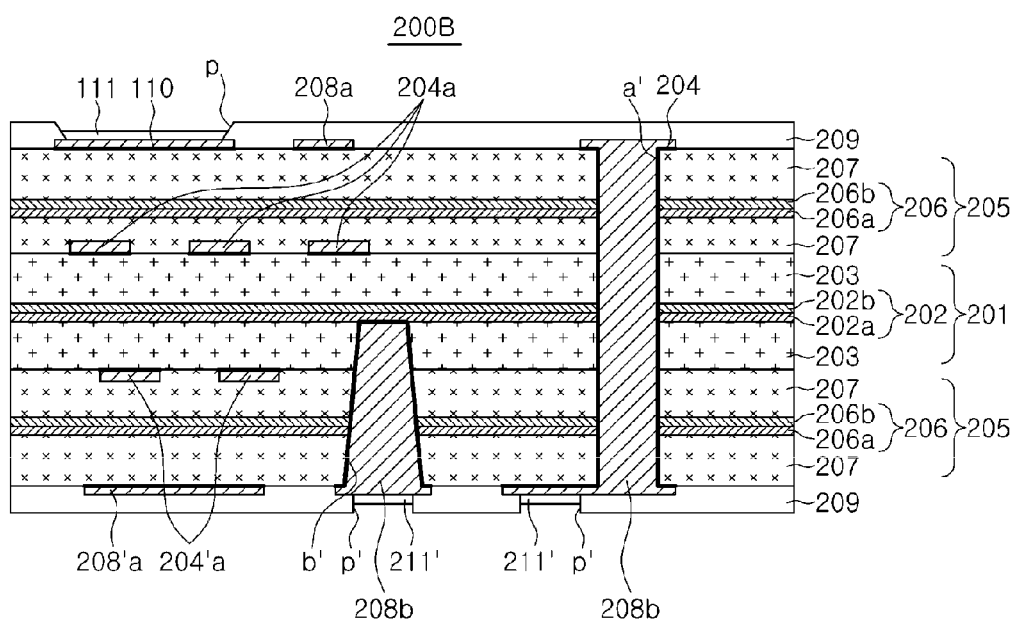

FIGS. 2A and 2B are schematic cross-sectional views of a printed circuit board including a bending prevention portion according to another embodiment of the present invention. The printed circuit board according to this embodiment of the invention will be described based on a four-layered printed circuit board including a bending prevention portion as an example.

The printed circuit board 200A according to the second embodiment of the present invention is configured to include: a core layer 201 that includes a bending prevention portion 202 interposed between insulating members 203 and 203'; core layers 205 that are formed on circuit patterns 204 and 204', in turn formed on the inner side of the core layer 201 or the outer side of the insulating members 203 and 203', and the insulating members 203 and 203'; and a solder resist 209 that is patterned so as to expose the circuit patterns 208 and 208' of the core layer 205.

Here, the bending prevention portion 202 is interposed between the insulating members 203 and 203'. The bending prevention portion 202 is configured by two-layer metals having different thermal expansion coefficients and is disposed in the core layer 201.

In a case where the printed circuit board 200A is used as an upper board of a POP (Package On Package) board, the bending prevention portion 202 is configured to include a first bending prevention layer 202a having a first thermal expansion coefficient and a second bending prevention layer 202b having a second thermal expansion coefficient, which is higher than the first thermal expansion coefficient, from the side of an opening portion P for bonding a solder ball in which a semiconductor element is to be mounted later.

In contrast, in a case where a printed circuit board 200B is used as a lower board of the POP board, the bending prevention portion 202 is configured to include the second bending prevention layer 202b having the second thermal expansion coefficient and the first bending prevention layer 202a having the first thermal expansion coefficient, which is lower than the second thermal expansion coefficient, from the side of the opening portion P for bonding a solder ball in which a semiconductor element is to be mounted later.

As described above, a metal that can be configured as the bending prevention portion 202 according to the second embodiment of the present invention, may be any arbitrary metal, as long as the metal satisfies the condition of configuring the first bending prevention layer 202a having the first thermal expansion coefficient and the second bending prevention layer 202b having the second thermal expansion coefficient that is higher than the first thermal expansion coefficient. As a preferred example, the bending prevention portion 202 according to the second embodiment of the invention may be configured to include invar or nickel (Ni) having a low thermal expansion coefficient as the first bending prevention layer 202a and copper or copper alloy having a higher thermal expansion coefficient greater than that of invar or nickel as the second bending prevention layer 202b.

Here, the circuit patterns 204 and 204' are formed on the inside of through holes a' and b', which are created by perforating one face and the other face of the core layer 201, or a part of the core layer 201 and both outer sides of the insulating members 203 and 203'. In addition, the circuit patterns 204 and 204' are formed so as to have predetermined patterns.

Here, a core layer 205 is formed on the insulating members 203 and 203'.

Similarly to the core layer 201, a bending prevention portion 206 is also disposed in the core layer 205.

In a case where the printed circuit board 200A is used as an upper board of a POP (Package On Package) board, the bending prevention portion 206 is configured to include a first bending prevention layer 206a having a first thermal expansion coefficient and a second bending prevention layer 206b having a second thermal expansion coefficient, which is higher than the first thermal expansion coefficient, from the side of an opening portion P for bonding a solder ball in which a semiconductor element is to be mounted later.

In contrast, in a case where a printed circuit board 200B is used as a lower board of the POP board, the bending prevention portion 206 is configured to include the second bending prevention layer 206b having the second thermal expansion coefficient and the first bending prevention layer 206a having the first thermal expansion coefficient, which is lower than the second thermal expansion coefficient, from side of the opening portion P for bonding a solder ball in which a semiconductor element is to be mounted later.

Commonly, as a printed circuit board for manufacturing a semiconductor package is exposed to high-temperature heat through the manufacturing process, a phenomenon in which the printed circuit board is bent upward (the printed circuit board having a concave shape of a smile, when viewed from the lengthwise edge) or is bent downward (the printed circuit board having a convex shape, when viewed from lengthwise edge) occurs.

Described in greater detail, a printed circuit board mounted in the upper package board shows a tendency to be bent into a concave shape at a room temperature and to be bent into a convex shape at a high temperature. In contrast to the behavior of the upper package board, a printed circuit board that is mounted in the lower package board shows a tendency to be bent into a convex shape at room temperature and to be bent into a concave shape at a high temperature.

In order to prevent the above-described bending phenomenon of the printed circuit board that occurs during a semiconductor package manufacturing process or through a reflow process, by disposing a bending prevention portion that is configured to have a metal having a low thermal expansion coefficient and a metal having a high thermal expansion coefficient in the printed circuit board that is mounted in the upper package board with the semiconductor mounting surface used as a reference and by disposing a bending prevention portion that is configured by a metal having a high thermal expansion coefficient and a metal having a low thermal expansion coefficient in the printed circuit board that is mounted in the lower package board with the semiconductor mounting surface used as a reference, stresses generated by the tendency of being bent that are generated in different directions are offset with each other so as to perform a function for maintaining the printed circuit board in a horizontal state, whereby the bending phenomenon of the printed circuit board can markedly decreased.

Here, the circuit patterns 208 and 208' are formed on the inside of through holes a' and b', which are created by perforating one face and the other face of the core layer 205, or a part of the core layer 101 and outer sides of the insulating members 207 and 207'. In addition, the circuit patterns 208 and 208' are formed so as to have predetermined patterns.

Here, the insulating layer 209 is formed on the insulating members 207 and 207' and includes the opening portions P and P' that expose the circuit patterns 208 and 208' so as to be later bonded to solder balls. The insulating layer 209 may be configured by a patterned solder resist.

Hereinafter, a process for forming the printed circuit board according to the first embodiment of the present invention will be described with reference to FIGS. 3A to 3F.

Figure 3A:
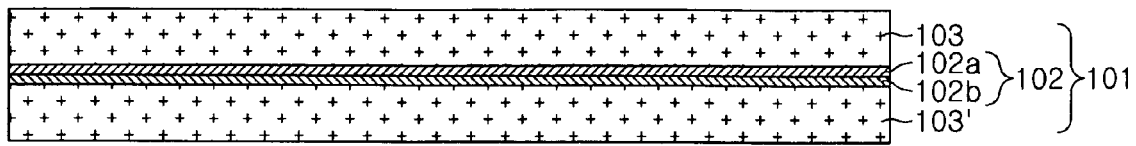
FIGS. 3A to 3F are schematic cross-sectional views illustrating a process for manufacturing a printed circuit board according to an exemplary embodiment of the present invention.

As illustrated in FIG. 3A, a core layer 101 is arranged by interposing a bending prevention portion 102, which is formed by two-layers of metal having different thermal expansion coefficients, between insulating members 103 and 103'. Here, the bending prevention portion 102 may be interposed between the insulating members 103 and 103' by being thermo-compressed.

In a case of the core layer 101 having the printed circuit board 100A of FIG. 1A is used as an upper board of a POP (Package On Package) board, the bending prevention portion 102 is configured to include a first bending prevention layer 102a having a first thermal expansion coefficient and a second bending prevention layer 102b having a second thermal expansion coefficient, which is higher than the first thermal expansion coefficient, from the side of an opening portion O, shown in FIG. 1A, for bonding a solder ball in which a semiconductor element is to be later mounted.

In contrast, in a case where the core layer 101, as the printed circuit board 100B of FIG. 1B, is used as a lower board of the POP board, the bending prevention portion 102 is configured to include the second bending prevention layer 102b having the second thermal expansion coefficient and the first bending prevention layer 102a having the first thermal expansion coefficient, which is lower than the second thermal expansion coefficient, from the side of the opening portion O, shown in FIG. 1B, for bonding a solder ball in which a semiconductor element is to be later mounted.

As described above, as a metal that can be configured as the bending prevention portion 102 according to the first embodiment of the present invention, any arbitrary metal can be used as long as the metal satisfies the condition of configuring the first bending prevention layer 102a to have the first thermal expansion coefficient and the second bending prevention layer 102b having the second thermal expansion coefficient that is greater than the first thermal expansion coefficient. As a preferred example, the bending prevention portion 102 according to the first embodiment of the invention may be configured to include invar or nickel (Ni) having a low thermal expansion coefficient as the first bending prevention layer 102a and copper or copper alloy that has a thermal expansion coefficient higher than that of invar or nickel as the second bending prevention layer 102b.

Figure 3B:
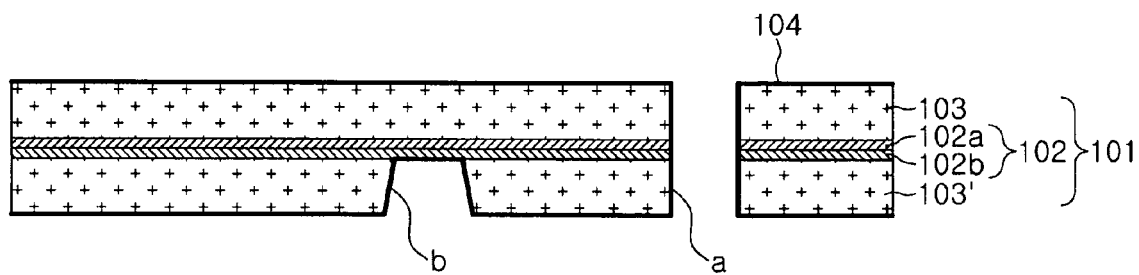

Next, as illustrated in FIG. 3B, for interlayer circuit connections, a through hole a and a blind via hole b are created in the insulating members 103 and 103'. Then, an electroless copper coating layer 104 is formed in the through hole a and the blind via hole b.

Here, a method of forming the through hole a in a position set in advance may be realized by using a CNC drill (Computer Numerical Control Drill) is used. In addition, a deburring process in which dust generated in a drilling process is removed from the side wall of the through hole a and the surfaces of the insulating members 103 and 103', and the like, may be performed further after the through hole a is created by using the CNC drill.

A method of forming the blind via hole b in a position set in advance by using YAG laser (Yttrium Aluminum Garnet laser) or a carbon dioxide laser (CO2 laser) may be used. In addition, a desmear process, in which smears generated due to melting from heat generated in the process for forming the blind via hole b on the side wall of the blind via hole b as the insulating members 103 and 103' and the bending prevention portion 102 are melt, may be performed after the blind via hole b is formed by using such laser.

As an embodiment, in the process of forming the electroless copper coating layer 104, a catalytic deposition method that includes a cleaning process, a soft etching process, a pre-catalyst process, a catalyst treatment process, an accelerator process, an electroless copper coating process, and an oxidation-prevention treatment process may be used.

As another embodiment, in the process for forming an electroless copper coating layer 104, a sputtering method in which the electroless copper coating layer 104 is formed in the through hole a and the blind via hole b by colliding gaseous ion particles which are generated due to plasma or the like (for example, Ar+) with a copper target.

Figure 3C:
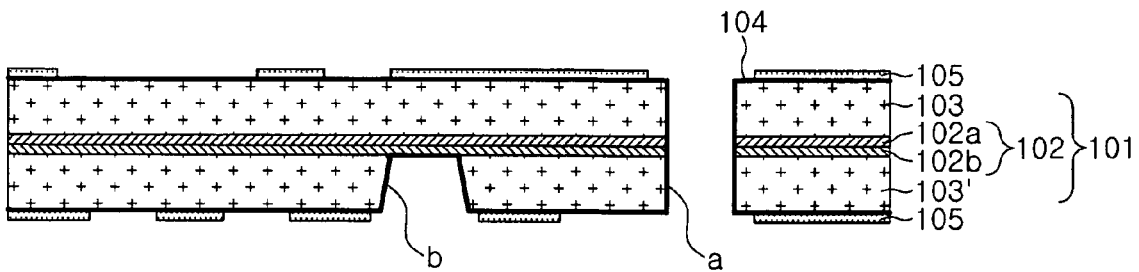

As illustrated in FIG. 3C, after the electroless copper coating layer 104 is coated with a dry film 105, a predetermined pattern is formed in the dry film 105 by performing an exposure process and a developing process.

Here, the predetermined pattern includes a general outer layer circuit pattern, the area of the through hole a, the area of the via hole b, a semiconductor element mounting portion, a wire bonding pad pattern, a solder ball pad patter, and the like.

As an embodiment, in the process for forming the predetermined pattern in the dry film 105, an artwork film (not shown) in which the predetermined pattern is printed is brought into close contact with the dry film 105, and then an ultraviolet ray is emitted thereupon. As the ultraviolet ray cannot be transmitted through a black portion in which the pattern of the artwork film is printed, the ultraviolet ray is transmitted through a non-printed portion whereby the dry film 105 under the artwork film is cured. When the dry film 105 cured as described above is soaked in a developing solution, a portion of the uncured dry film 105 is eliminated by the developing solution. Accordingly, only a portion of the cured dry film 105 is left, whereby the predetermined plating resist pattern is formed.

Figure 3D:
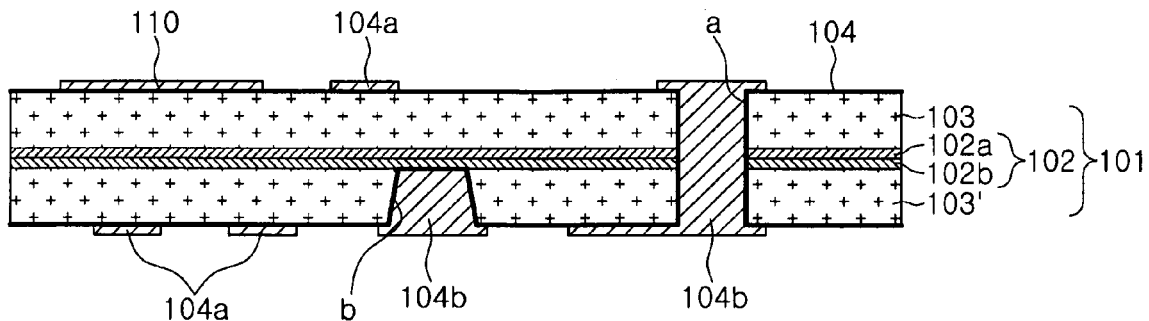

As illustrated in FIG. 3D, circuit patterns 104a and 104b formed by electrolyte copper plating are formed in the areas of the electroless copper plating layer 104, the through hole a, and the blind via hole b by using the dry film 105 on which the predetermined pattern is formed as a plating resist. Next, the coated dry film 105 is peeled off so as to be removed.

Here, as a method of forming the circuit patterns 104a and 104b by the electrolytic copper plating, after a raw material is eroded in a copper plating operation tank, electrolytic copper plating is performed by using a DC rectifier. In the electrolytic copper plating, an area to be plated may be calculated, and an appropriate current is allowed to flow from the DC rectifier so as to deposit copper is used. The electrolytic copper plating process has advantages in that the physical characteristics of the copper plating layer are superior to the electroless copper plating layer, and a thick copper playing layer can be formed in an easy manner.

Figure 3E:
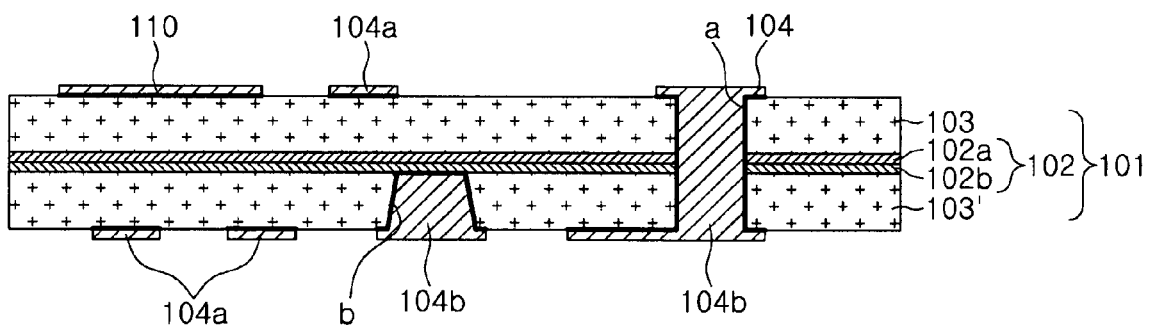

As in FIG. 3E, by performing a flash etching process in which an etching solution is sprayed, the electroless copper plating layer 104 located in a portion in which the circuit patterns 104a and 104b formed by the electrolytic copper plating are not formed is removed.

In this process, the formation of the semiconductor element mounting portion 110 and the outer-layer circuit patterns 104a and 104b, and other dummy areas (not shown) of the package area according to an embodiment of the present invention is completed.

Figure 3F:
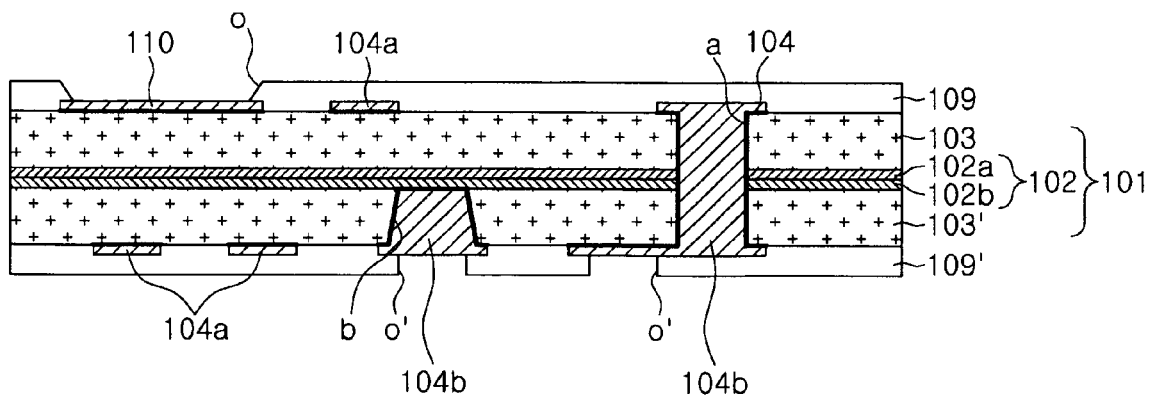

Next, as illustrated in FIG. 3F, an area positioned on the insulating members 103 and 103' on which the circuit pattern 104a and the electroless copper plating layer 104 are formed is coated with solder resists 109 and 109' and is preliminarily dried. Then, by performing an exposure process, a developing process, and an etching process for the upper and lower solder resists 109 and 109', the semiconductor element mounting portion 110 in which a semiconductor element is mounted and an opening portion O, corresponding to a wire bonding pad that is connected to the semiconductor element are formed in the upper solder resist 109, and an opening portion O', corresponding to a solder ball pad that is to be later connected to a motherboard and the like is formed in the lower solder resist 109'. Next, the upper and lower solder resists 109 and 109' are completely cured.

Then, as illustrated in FIG. 1A, gold plating layers 111 and 111' are formed in the semiconductor element mounting area 110, the wire bonding pad, and the solder ball pads that are the opening portions O and O' of the upper and lower resists 109 and 109'.

In the embodiment, in order to improve the adhesiveness of the gold, the gold plating layers 111 and 111' may be formed after nickel is thinly plated thereupon.

According to an embodiment of the present invention, by disposing a bending prevention portion inside the printed circuit board, a printed circuit board capable of improving the progress rate and the productivity and a method of manufacturing the printed circuit board can be provided.

In addition, the printed circuit board that is manufactured according to an embodiment of the present invention can improve the assembly by disposing the bending prevention portion inside the printed circuit board. Accordingly, there is an advantage in that the manufacturing costs can be reduced.

While the present invention has been shown and described in connection with the exemplary embodiments, it will be apparent to those skilled in the art that modifications and variations can be made without departing from the spirit and scope of the invention as defined by the appended claims.

What is claimed is:

1. A printed circuit board comprising:
a core layer in which is disposed a bending prevention portion of at least two layers that is interposed between a plurality of insulating members and comprises metal layers having different thermal expansion coefficients;
a circuit pattern formed so as to have a desired pattern on at least one inner side of the core layer and an outer side of the core layer; and
an insulating layer formed on the core layer and including an opening portion that exposes the circuit pattern.

2. The printed circuit board of claim 1, wherein
the bending prevention portion comprises a first bending prevention layer having a first thermal expansion coefficient and a second bending prevention layer having a second thermal expansion coefficient that is higher than the first thermal expansion coefficient, and
the first bending prevention layer is formed such that the first bending prevention layer is closer to the opening portion side than the second bending prevention layer.

3. The printed circuit board of claim 1, wherein
the bending prevention portion comprises a second bending prevention layer having a second thermal expansion coefficient and a first bending prevention layer having a first thermal expansion coefficient that is lower than the second thermal expansion coefficient, and
the second bending prevention layer is formed where the second bending prevention layer is closer to the opening portion side than the first bending prevention layer.

4. The printed circuit board of claim 2, wherein the first bending prevention layer is formed from invar or nickel (Ni), and the second bending prevention layer is formed from copper or copper alloy.

5. The printed circuit board of claim 3, wherein the first bending prevention layer is formed from invar or nickel (Ni), and the second bending prevention layer is formed from copper or copper alloy.

6. The printed circuit board of claim 1, wherein the insulating layer is a solder resist that is patterned so as to expose the circuit pattern.

7. The printed circuit board of claim 1, further comprising a through hole formed by perforating at least one face of the core layer.

* * * * *